US007174952B1

(12) United States Patent
Hong et al.

(10) Patent No.: US 7,174,952 B1
(45) Date of Patent: Feb. 13, 2007

(54) HEAT DISSIPATION DEVICE

(75) Inventors: Alex Hong, Kaohsiung (TW); Ko Chien Wang, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 0 days.

(21) Appl. No.: 11/248,244

(22) Filed: Oct. 13, 2005

(30) Foreign Application Priority Data

Aug. 15, 2005 (TW) .............................. 94127688 A

(51) Int. Cl.
*H05K 7/20* (2006.01)
(52) U.S. Cl. .................. 165/122; 165/80.3; 361/697
(58) Field of Classification Search ................. None
See application file for complete search history.

(56) References Cited

U.S. PATENT DOCUMENTS

| 5,699,854  | A  | * | 12/1997 | Hong ......................... 165/121   |
|------------|----|---|---------|-----------------------------------------|
| 5,727,624  | A  | * | 3/1998  | Ko et al. ..................... 165/121 |
| 6,109,890  | A  | * | 8/2000  | Horng ..................... 417/423.14   |
| 6,125,924  | A  | * | 10/2000 | Lin ............................ 165/122 |
| 6,170,563  | B1 | * | 1/2001  | Hsieh ......................... 165/122  |
| 6,243,263  | B1 | * | 6/2001  | Kitahara ....................... 361/695 |
| 6,348,748  | B1 | * | 2/2002  | Yamamoto ..................... 310/62    |
| 6,421,239  | B1 | * | 7/2002  | Huang ......................... 361/696  |
| 6,681,845  | B1 | * | 1/2004  | Yeh et al. ..................... 165/122 |
| 6,698,500  | B2 | * | 3/2004  | Noda et al. ................. 165/80.3   |
| 6,725,906  | B2 | * | 4/2004  | Lin et al. ..................... 361/695 |
| 6,912,128  | B2 | * | 6/2005  | Bird et al. ................... 361/695  |
| 2004/0100769 | A1 | * | 5/2004  | Chung et al. ............... 361/697   |
| 2005/0257532 | A1 | * | 11/2005 | Ikeda et al. ................... 62/3.7 |
| 2006/0039113 | A1 | * | 2/2006  | Cheng et al. ............... 361/700   |

* cited by examiner

*Primary Examiner*—Allen J. Flanigan
(74) *Attorney, Agent, or Firm*—Bacon & Thomas

(57) ABSTRACT

The present invention relates to a heat dissipation device comprising a heat dissipation base and an upper lid. The heat dissipation base is integrally formed by a metal material with superior heat conductivity, and has an airflow channel and an accommodating space. The upper lid covers the accommodating space. The airflow channel communicates with the accommodating space, and the airflow channel has an outlet on one side thereof and a plurality of heat dissipation fins in the interior thereof. The accommodating space has a blade set in the interior thereof, which speeds the dissipation of the heat by forcing the airflow. The advantages of the heat dissipation device of the present invention are to be assembled easily; no noise and turbulent flow; and its application type and occasion are not limited.

14 Claims, 5 Drawing Sheets

HEAT DISSIPATION DEVICE

FIELD OF THE INVENTION

The present invention is related to a heat dissipation device, which is disposed in the interior of a slim electronic system, can serve as a media of absorbing and conducting heat, and dissipate the heat generated by the electronic system by utilizing the blades of a blade set to force the airflow.

DESCRIPTION OF THE RELATED ART

ROC (Taiwan) Patent Publication No. 316733 entitled "Slim Fan Structure with Oriented Airflow" discloses a heat dissipation fan with an outlet on one side thereof. The heat dissipation fan comprises a substrate having an accommodating space and an outlet, and a blade set is disposed in the accommodating space.

However, the complex integrated circuits may cause serious heat dissipation problem, especially to a slim electronic system, because the interior space is not enough to maintain sufficient airflow by conventional convection.

ROC (Taiwan) Patent Publication No. I228215 entitled "Heat Dissipation Device" discloses a heat dissipation device. The heat dissipation device includes a cooling fan and a plurality of heat dissipation fins. The heat dissipation fins are disposed at an outlet of the cooling fan to exhaust heat on the heat dissipation fins with an airflow generated by the cooling fan so as to increase the heat dissipation efficiency. Although the patent emphasizes the design that the heat dissipation fins are arranged according to predetermined spaces, it does not disclose its actual structure.

Additionally, ROC (Taiwan) Patent Publication No. M268900 entitled "Heat Dissipation Device" discloses a heat dissipation device comprising a first heat dissipation element and a second heat dissipation element. The first heat dissipation element is a side-flow fan type, the second heat dissipation element is a heat dissipation fin type, and the two heat dissipation elements dissipate the heat generated by two heat source elements respectively.

The characteristic of the patent is dissipating heat generated by the two heat source elements. Therefore, the bottom surface of the accommodating space of the first heat dissipation element must be closed, which cannot have an inlet disposed thereon. As a result, the fan only can inhale the air one-way from the top. On one hand, the disposition of the heat dissipation device in the system is limited, and on the other hand, airflow volume and airflow pressure are also limited, which results in poor heat dissipation efficiency.

FIG. 1 shows a schematic diagram of a conventional heat dissipation base. The conventional heat dissipation base 40 has an airflow channel 41 and an accommodating space 42, wherein the airflow channel 41 communicates with the accommodating space 42, and the airflow channel 41 has an outlet 43 on one side thereof.

The bottom of the accommodating space 42 is an opening without any shelter, and is covered by a lower plate 51. The lower plate 51 is a metal plate formed by pressing, and has an inlet 511 and a plurality of rivet holes 512 so as to be riveted on the accommodating space 42. A receiving rim 421 is disposed on the accommodating space 42 and is used for receiving a fan set 52. The fan set 52 is assembled with a blade set 60 that is disposed reversely in the accommodating space 42.

A plurality of heat dissipation fins 80 are disposed in the air flow channel 41, and are used for absorbing the heat generated by heat source elements. The heat dissipation fins 80 serves as a media of conducting heat, and speeds the dissipation of the heat by utilizing the blade set 60 that can force the airflow.

The conventional structure has the following disadvantages:

1. Complicated manufacture process and low yield: The heat dissipation base 40 is assembled with the lower plate 51, fan set 52 and the heat dissipation fins 80. And it is manual to accomplish the assembly, which results in complicated manufacture process and low yield of product.

2. Noise: The lower plate 51 is a metal plate formed by pressing, which will resonate with the airflow whirled by the blade set 60 and generate noise.

3. Turbulent flow: In additional to resonance and noise, the lower plate 51 will generate a turbulent flow due to its poor flatness.

4. Overall thickness is not controllable: Cumulative error caused by the assembly of the heat dissipation base 40, the lower plate 51 and the fan set 52 makes the overall thickness to be uncontrollable. To control the thickness precisely is very important to the slim electronic system.

5. Application type and occasion are limited: The lower plate 51 is a metal plate formed by pressing, which does not provide disposition for the blade set 60. Thus, the direction and disposition of the inlet 511 is limited, and the application occasion of the conventional structure is limited.

Consequently, the present invention is to provide a heat dissipation device to solve the above-mentioned problems of the conventional structure thoroughly.

SUMMARY OF THE INVENTION

The main object of the present invention is to provide a heat dissipation device comprising a heat dissipation base and an upper lid. The heat dissipation base is integrally formed by a metal material with superior heat conductivity, and has an airflow channel and an accommodating space. The upper lid covers the accommodating space. The airflow channel communicates with the accommodating space, and the airflow channel has an outlet on one side thereof and a plurality of heat dissipation fins in the interior thereof. The accommodating space has a blade set in the interior thereof, which speeds the dissipation of the heat by forcing the airflow.

The advantages of the heat dissipation device of the present invention are to be assembled easily; no noise and turbulent flow; and its application type and occasion are not limited so that it can solve the above-mentioned problems of the conventional structure.

DETAILED DESCRIPTION OF THE INVENTION

The present invention is related to a heat dissipation device, which is applied to dissipate the heat generated by a slim electronic system. Several embodiments of the present invention are described as follows.

Figure 1:
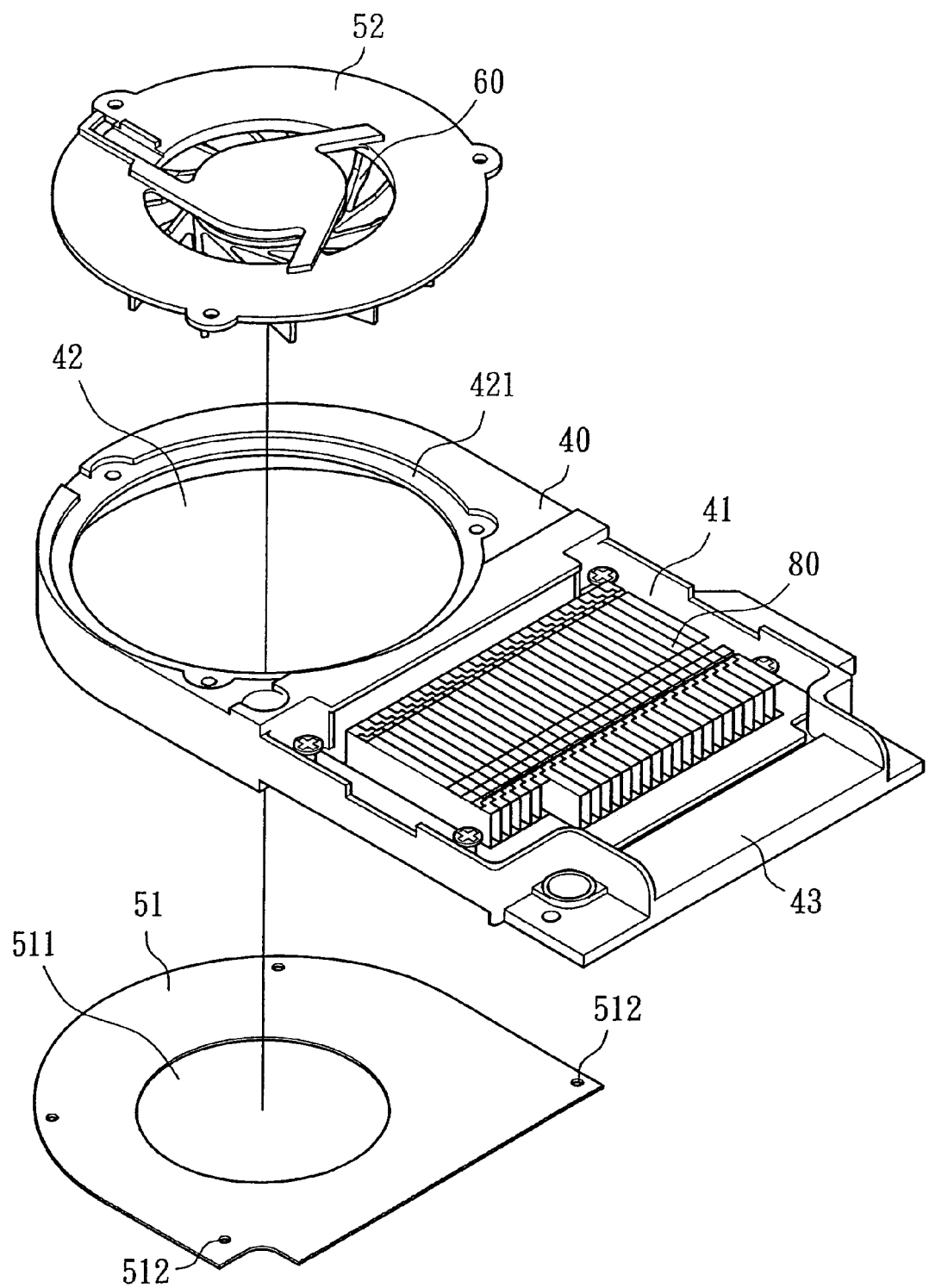
FIG. 1 shows a schematic diagram of a conventional heat dissipation device.
Figure 2:
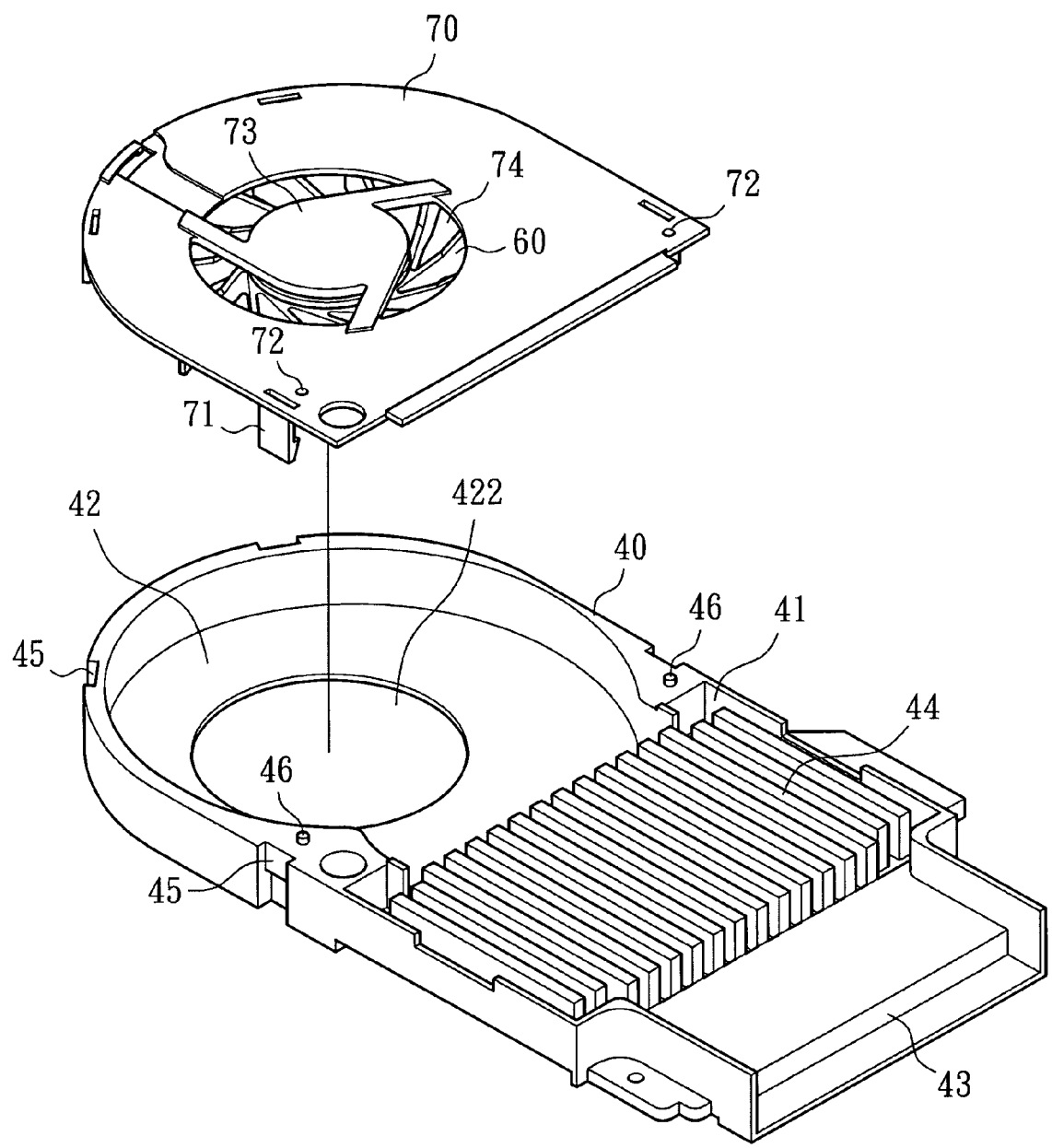
FIG. 2 shows a perspective and exposed view of a heat dissipation device according to a first embodiment of the present invention.

Referring to FIG. 2, a heat dissipation device according to a first embodiment of the present invention is shown. The heat dissipation device comprises a heat dissipation base 40 and an upper lid 70.

The heat dissipation base 40 is integrally formed by a metal material (for example, aluminum alloy) with superior heat conductivity. The heat dissipation base 40 has an airflow channel 41 and an accommodating space 42. The airflow channel 41 communicates with the accommodating space 42, and the airflow channel 41 has an outlet 43 on one side thereof.

The airflow channel 41 has a plurality of heat dissipation fins 44 in the interior thereof. The heat dissipation fins 44 are integrally formed with the heat dissipation base 40, and can serve as a media of conducting heat. The accommodating space 42 has at least one inlet 422 on the interior bottom side thereof. The upper lid 70 is used for covering the accommodating space 42, and has a fan set 73 thereon. The fan set 73 is assembled with a blade set 60 that has a plurality of inlets 74 on its periphery, which can absorb airflow form its top side and bottom side so as to increase the airflow volume and airflow pressure.

The heat dissipation fins 44 can serve as a media of absorbing and conducting the heat generated by a heat source element, and the blade set 60 is utilized to force the airflow and speed up the heat dissipation.

Additionally, the heat dissipation base 40 has a plurality of receiving recesses 45 and positioning pins 46 on the periphery thereof and corresponding to the accommodating space 42. The upper lid 70 has a plurality of hooks 71 and positioning holes 72 corresponding to the receiving recesses 45 and positioning pins 46, respectively. Whereby, the hooks 71 hook in the receiving recesses 45 and the positioning pins 46 are received in the positioning holes 72, when the heat dissipation base 40 is assembled with the upper lid 70

Figure 3:
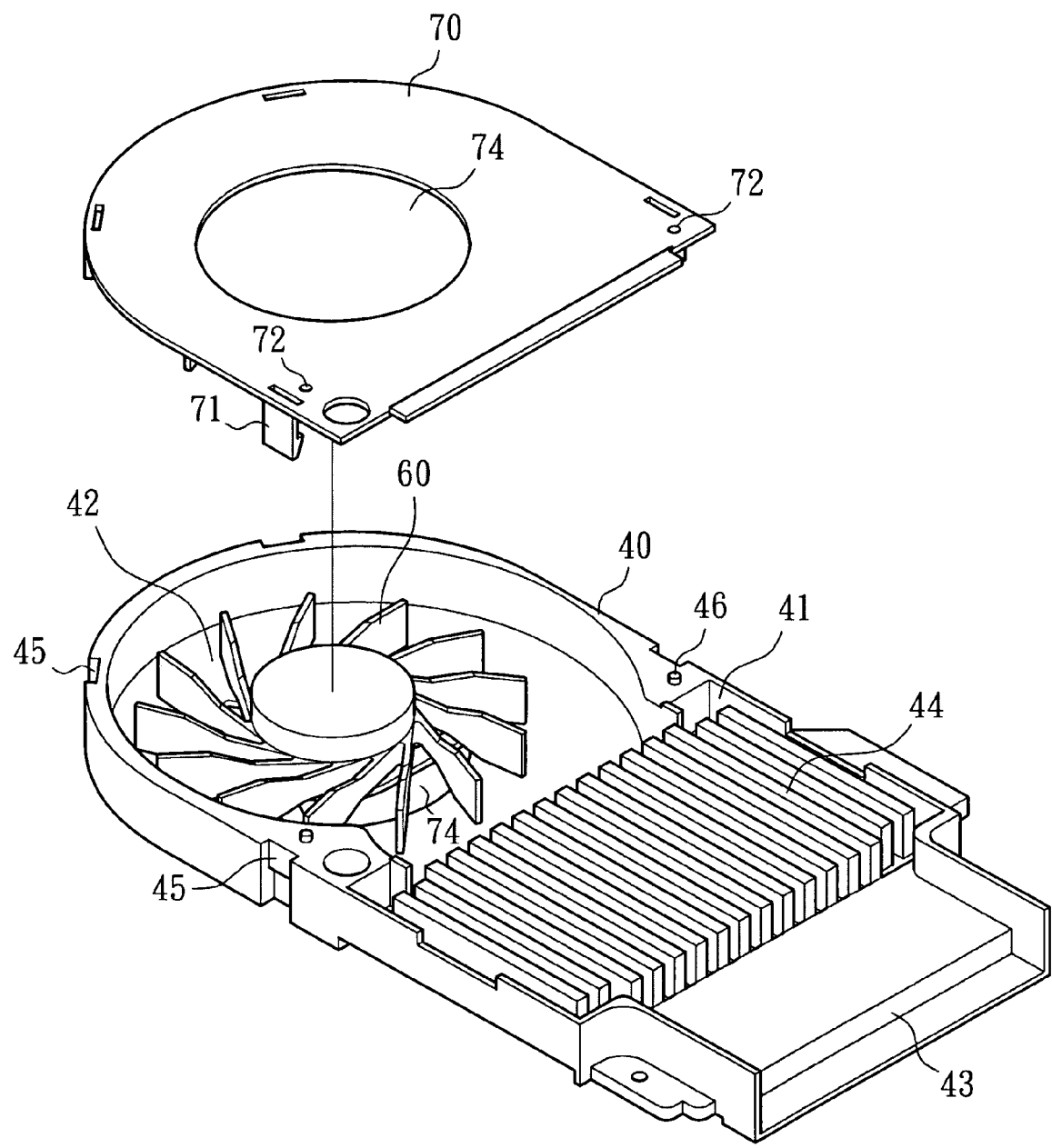
FIG. 3 shows a perspective and exposed view of a heat dissipation device according to a second embodiment of the present invention.

Referring to FIG. 3, a heat dissipation device according to a second embodiment of the present invention is shown. The heat dissipation device comprises a heat dissipation base 40 and an upper lid 70.

The heat dissipation base 40 is integrally formed by a metal material (for example, aluminum alloy) with superior heat conductivity. The heat dissipation base 40 has an airflow channel 41 and an accommodating space 42. The airflow channel 41 communicates with the accommodating space 42, and the airflow channel 41 has an outlet 43 on one side thereof.

The characteristic of the second embodiment is as follows.

The interior bottom side of the accommodating space 42 has a fan set on which the blade set 60 is disposed. The blade set 60 has a plurality of inlets 74 on the periphery thereof. Further, the upper lid 70 also has an inlet 74. Therefore, the heat dissipation device can absorb airflow form its top side and bottom side so as to increase the airflow volume and airflow pressure.

Figure 4:
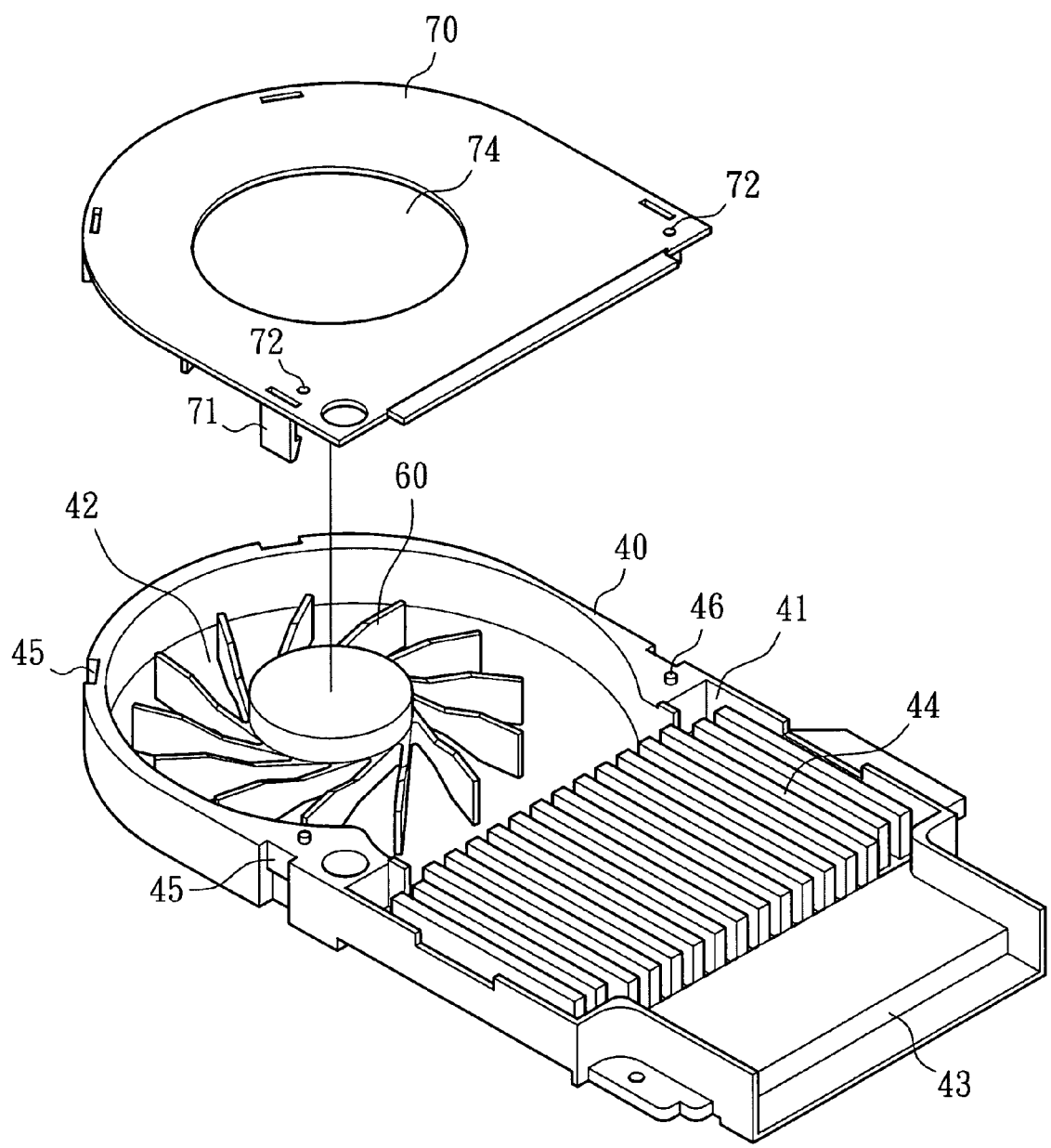
FIG. 4 shows a perspective and exposed view of a heat dissipation device according to a third embodiment of the present invention.

Referring to FIG. 4, a heat dissipation device according to a third embodiment of the present invention is shown. The heat dissipation device comprises a heat dissipation base 40 and an upper lid 70.

The heat dissipation base 40 is integrally formed by a metal material (for example, aluminum alloy) with superior heat conductivity. The heat dissipation base 40 has an airflow channel 41 and an accommodating space 42. The airflow channel 41 communicates with the accommodating space 42, and the airflow channel 41 has an outlet 43 on one side thereof.

The characteristic of the third embodiment is as follows.

The blade set 60 is disposed on the interior bottom side of the accommodating space 42 that has no inlet. The outer sides of the bottom of the accommodating space 42 and the airflow channel 41 can contact two heat source elements respectively and dissipate the heat generated by the two heat source elements.

Figure 5:
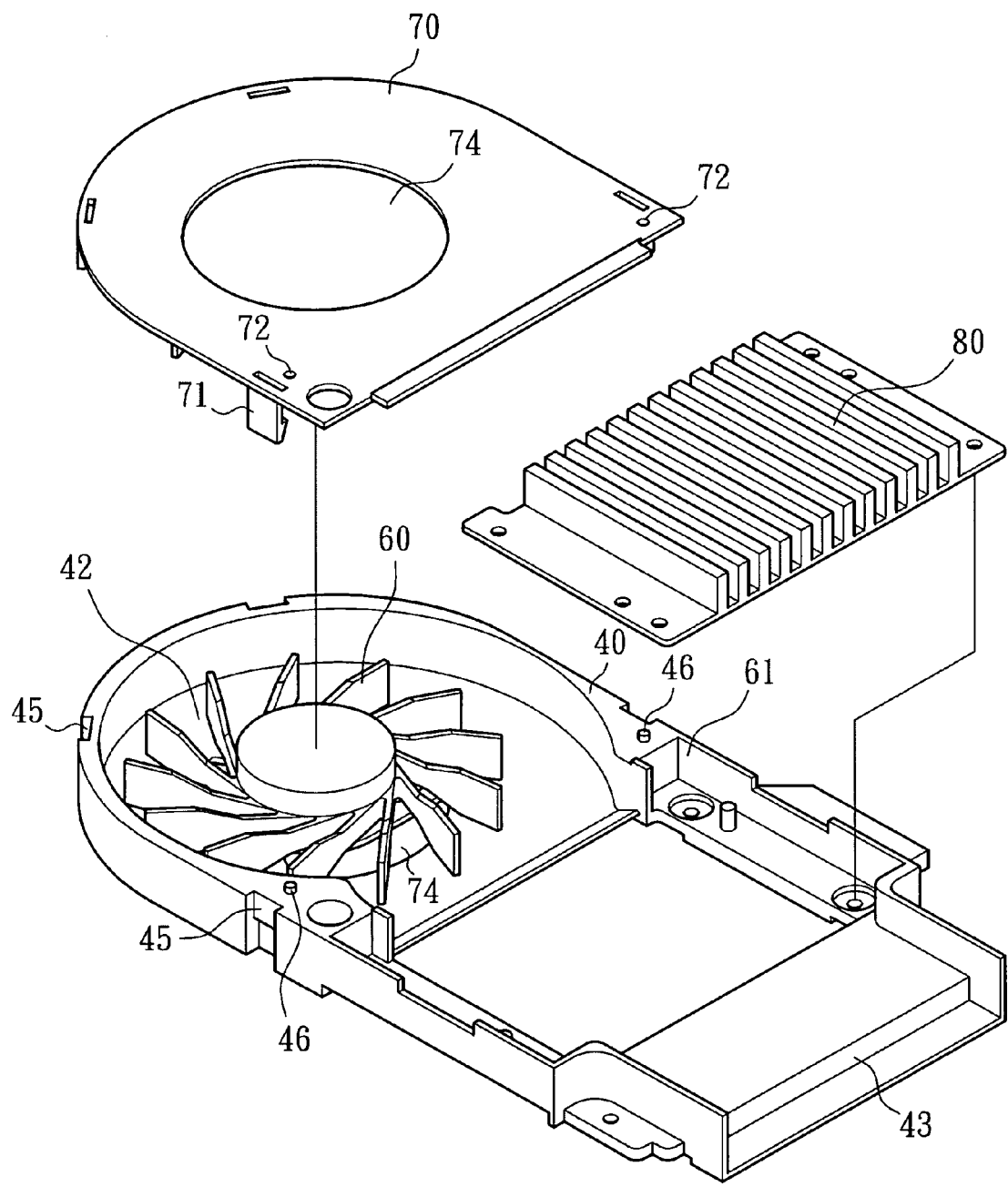
FIG. 5 shows a perspective and exposed view of a heat dissipation device according to a fourth embodiment of the present invention.

Referring to FIG. 5, a heat dissipation device according to a fourth embodiment of the present invention is shown. The characteristic of the fourth embodiment is as follows. The heat dissipation fins 80 and the heat dissipation base 40 are not integrally formed. The heat dissipation fins 80 can be formed by different materials with more superior heat conductivity, such as copper alloy, so as to provide excellent heat dissipation efficiency.

In conclusion, the assembly procedure of the present invention is only to assemble the heat dissipation base and the upper lid, which needs no manual kits and is simplified. The heat dissipation base is integrally formed so that the bottom side of the accommodating space has good flatness, the noise and the turbulent flow are avoided, and the overall thickness is controllable. Furthermore, the direction and disposition of the inlet can be designed according actual requirement, for example, it can be designed to inhale the air one-way or two-way, or it can be designed to dissipate two heat source elements.

From the invention thus described, it will be obvious that this invention as described above is provided for explanation and that the invention may be varied in many ways, where such variations are not to be regarded as departing from the spirit and scope of the invention, and all such modifications as would be obvious to one skilled in the art are intended for inclusion within the scope of the following claims.

What is claimed is:

1. A heat dissipation device comprising:
    a heat dissipation base integrally formed from a metal material with a superior heat conductivity, the heat dissipation base having a plurality of receiving recesses, an airflow channel and an accommodating space, wherein the receiving recesses are arranged on the periphery of the heat dissipation base, the airflow channel communicates with the accommodating space, the airflow channel has an outlet on one side thereof and a plurality of heat dissipation fins in the interior thereof, and the accommodating space has at least one inlet and a blade set in the interior thereof; and
    an upper lid for covering the accommodating space, the upper lid having a plurality of hooks corresponding to the receiving recesses;
    wherein at least one of the at least one inlets is disposed on the interior bottom side of the accommodating space, and the blade set is connected to the upper lid.

2. The heat dissipation device of claim 1, wherein the material of the heat dissipation base is aluminum alloy.

3. The heat dissipation device of claim 1, wherein at least one of the at least one inlets is disposed on the upper lid, and the blade set is disposed on the interior bottom side of the accommodating space.

4. The heat dissipation device of claim 1, wherein the heat dissipation fins and the heat dissipation base are integrally formed.

5. The heat dissipation device of claim 3, wherein the heat dissipation fins and the heat dissipation based are separable and formed from different materials.

6. The heat dissipation device of claim 1, wherein the material of the heat dissipation fins is copper alloy.

7. The heat dissipation device of claim 1, further comprising a plurality of positioning pins disposed on the heat dissipation base, and a plurality of positioning holes corresponding to the positioning pins and disposed on the upper lid.

8. A heat dissipation device comprising:

a heat dissipation base integrally formed from a metal material with a superior heat conductivity, the heat dissipation base having a plurality of positioning pins and plurality of receiving recesses, an airflow channel and an accommodating space, wherein the receiving recesses are arranged on the periphery of the heat dissipation base, the airflow channel communicates with the accommodating space, the airflow channel has an outlet on one side thereof and a plurality of heat dissipation fins in the interior thereof, and the accommodating space has at least one inlet and a blade set in the interior thereof; and an upper lid for covering the accommodating space, the upper lid having a plurality of hooks corresponding to the receiving recesses and a plurality of positioning holes corresponding to the plurality of positioning pins.

9. The heat dissipation device of claim 8, wherein the material of the heat dissipation base is aluminum alloy.

10. The heat dissipation device of claim 8, wherein the inlet is disposed on the interior bottom side of the accommodating space, and the blade set is connected to the upper lid.

11. The heat dissipation device of claim 8, wherein at least one of the at least one inlets is disposed on the upper lid, and the blade set is disposed on the interior bottom side of the accommodating space.

12. The heat dissipation device of claim 10, wherein the heat dissipation fins and the heat dissipation base are integrally formed.

13. The heat dissipation device of claim 11, wherein the heat dissipation fins and the heat dissipation based are separable and formed from different materials.

14. The heat dissipation device of claim 8, wherein the material of the heat dissipation fins is copper alloy.

* * * * *